US009984749B2

(12) United States Patent
Em et al.

(10) Patent No.: US 9,984,749 B2
(45) Date of Patent: May 29, 2018

(54) CURRENT DRIVER, WRITE DRIVER, AND SEMICONDUCTOR MEMORY APPARATUS USING THE SAME

(71) Applicant: SK hynix Inc., Icheon-si Gyeonggi-do (KR)

(72) Inventors: Ho Seok Em, Hwaseong-si (KR); Seok Joon Kang, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days. days.

(21) Appl. No.: 15/483,326

(22) Filed: Apr. 10, 2017

(65) Prior Publication Data

US 2018/0047447 A1    Feb. 15, 2018

(30) Foreign Application Priority Data

Aug. 9, 2016   (KR) .................... 10 2016 0101307

(51) Int. Cl.
    G11C 11/00     (2006.01)
    G11C 13/00     (2006.01)
    H03K 3/012     (2006.01)
    G06F 1/32      (2006.01)

(52) U.S. Cl.
    CPC ........ *G11C 13/0069* (2013.01); *G06F 1/3287* (2013.01); *G11C 13/004* (2013.01); *G11C 13/0061* (2013.01); *G11C 13/0097* (2013.01); *H03K 3/012* (2013.01); *G06F 1/3296* (2013.01); *G11C 2013/0078* (2013.01)

(58) Field of Classification Search
    CPC .............. G11C 13/0069; G11C 13/004; G11C 13/0061; G11C 13/0097; G06F 1/3287; G06F 1/3296; H03K 3/012
    USPC ......... 365/148, 185.05, 185.18, 51, 63, 129, 365/174, 175, 177, 189.011
    See application file for complete search history.

(56) References Cited

U.S. PATENT DOCUMENTS

| 8,223,580 | B2 | 7/2012 | Parkinson | |
|---|---|---|---|---|
| 2004/0178403 | A1* | 9/2004 | Ovshinsky | G11C 13/0004 257/4 |
| 2009/0310402 | A1* | 12/2009 | Parkinson | G11C 13/0004 365/163 |
| 2011/0304362 | A1* | 12/2011 | Matsubara | G05F 3/262 327/109 |
| 2015/0318039 | A1* | 11/2015 | Park | G11C 13/004 365/148 |
| 2016/0141034 | A1* | 5/2016 | Tran | G06F 17/5081 365/185.11 |
| 2016/0254320 | A1* | 9/2016 | Murooka | G11O 5/06 438/238 |

* cited by examiner

*Primary Examiner* — Fernando Hidalgo
(74) *Attorney, Agent, or Firm* — William Park & Associates Ltd.

(57) ABSTRACT

A current driver may include a current applying circuit and a current adjusting circuit. The current applying circuit may include a threshold switching element, and may provide unlimited amount of current while occupying small circuit area therefor. The current adjusting circuit may provide a bias voltage and control an amount of the current provided from the current applying circuit.

12 Claims, 8 Drawing Sheets

CURRENT DRIVER, WRITE DRIVER, AND SEMICONDUCTOR MEMORY APPARATUS USING THE SAME

CROSS-REFERENCES TO RELATED APPLICATION

The present application claims priority under 35 U.S.C. § 119(a) to Korean application number 10-2016-0101307 filed on Aug. 9, 2016 in the Korean Intellectual Property Office, which is incorporated herein by reference in its entirety.

BACKGROUND

1. Technical Field

Various embodiments generally relate to a semiconductor technology, and more particularly to a current driver, a write driver, and a semiconductor memory apparatus using the same.

2. Related Art

Like other electronic device consisting of a lot of electronic elements, a computer system consists of lots of electronic elements such as semiconductor-based electronic elements. The computer system may use a memory apparatus to store information. A dynamic random access memory (DRAM) is widely used as a primary storage or a main memory since the DRAM has the advantages in terms of fast data input/output speed and random access. However, the DRAM uses capacitors to store information and thus is volatile (i.e., the DRAM loses stored data when power supply is cut off). Unlike the volatile memory, a non-volatile memory such as a flash memory apparatus, which has a plurality of memory cells each including a floating gate, may retain stored data even when power supply is cut off. However, the flash memory apparatus is slower than the DRAM.

Recently, the next-generation memory apparatuses that offer fast operation speed and non-volatility are being researched and developed. Examples of the next-generation memory apparatuses include a Phase-Change Random Access Memory (PCRAM), a Resistive Random Access Memory (RRAM), a Magnetic Random Access Memory (MRAM), and a Ferroelectric Random Access Memory (FRAM). Particularly, the PCRAM, which includes an information storage element made of a chalcogenide material and stores data by changing resistance values of the memory cells, provide advantages in terms of fast operation speed and non-volatility.

SUMMARY

In an embodiment, a current driver may include a current applying circuit and a current adjusting circuit. The current applying circuit may include a threshold switching element configured to be turned on based on a power supply voltage, a first enable signal, and a setting voltage, and configured to provide a current. The current adjusting circuit may control an amount of the current provided from the current applying circuit based on a second enable signal and a bias voltage.

In an embodiment, a semiconductor memory apparatus may include a write driver and a memory cell. The write driver may generate a program current based on a program signal. The memory cell may store data by receiving the program current. The write driver may include a current applying circuit and a current adjusting circuit. The current applying circuit may have an Ovonic Threshold Switch configured to be turned on based on a power supply voltage, a first enable signal and a setting voltage, and configured to provide a current. The current adjusting circuit may control an amount of the current provided from the current applying circuit based on a second enable signal and a bias voltage.

DETAILED DESCRIPTION

Hereinafter, a semiconductor apparatus according to an embodiment of the present invention will be described below with reference to the accompanying drawings.

Figure 1:
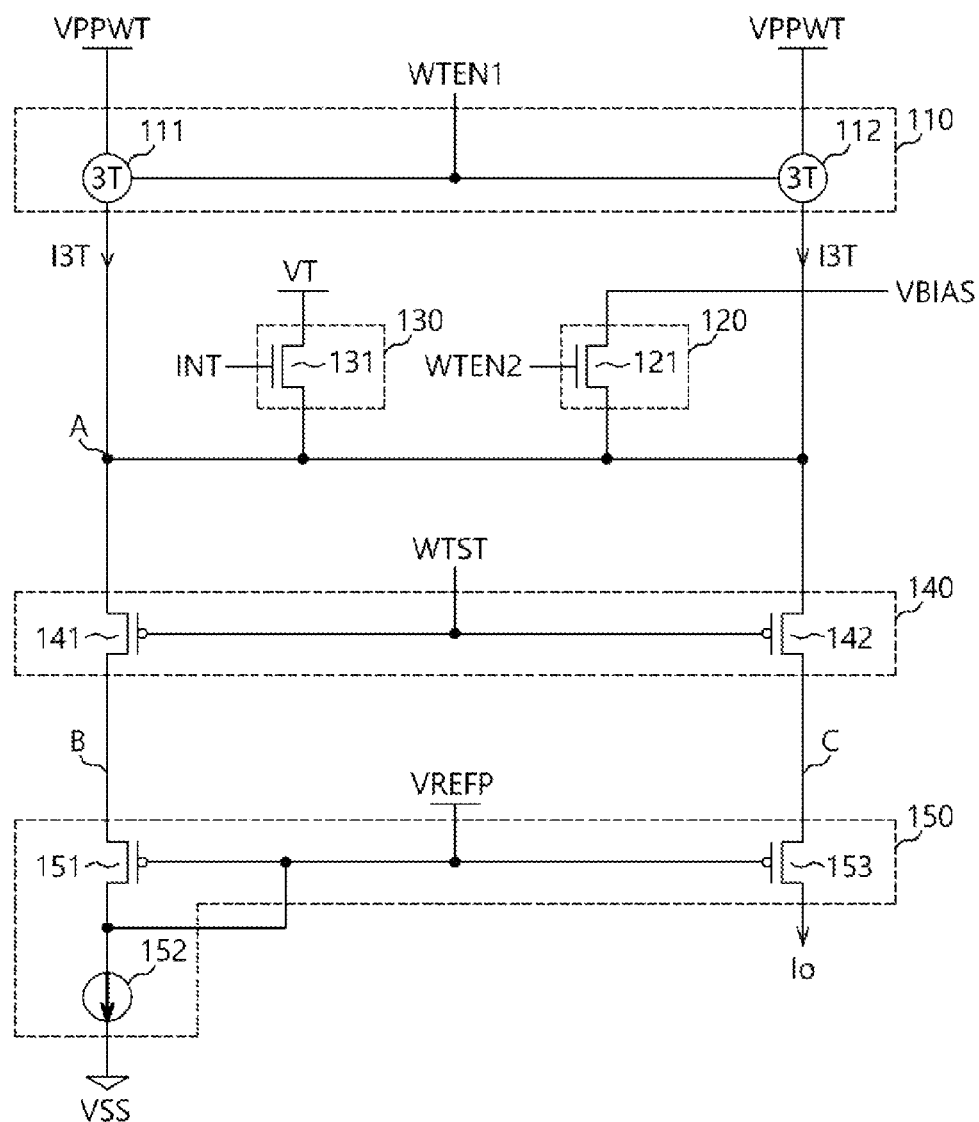
FIG. 1 is a diagram illustrating an example configuration of a current driver in accordance with an embodiment.

FIG. 1 is a diagram illustrating an example configuration of a current driver 100 in accordance with an embodiment. Referring to FIG. 1, the current driver 100 may generate a wide range of current by using a switch made of a phase-changeable material or a resistance-changeable material. The current driver 100 may include a switch showing a threshold switching effect. This switch may be made of glassy materials such as chalcogenide materials. For example, the switch here may be a threshold switching element such as an Ovonic Threshold Switch. In an embodiment, the switch may be a three-terminal Ovonic Threshold Switch. The current driver 100 may include a current applying circuit 110 and a current adjusting circuit 120. The current applying circuit 110 may include a threshold switching element. For example, the current applying circuit 110 may include an Ovonic Threshold Switch. The current applying circuit 110 may receive a power supply voltage VPPWT and provide a current based on a first enable signal WTEN1. The current applying circuit 110 may be coupled between the power supply voltage VPPWT and a first node A. The current applying circuit 110 may further receive a setting voltage VT, and may provide a current to the first node A based on the power supply voltage VPPWT, the first enable signal WTEN1, and the setting voltage VT. The current applying circuit 110 may include a first Ovonic Threshold Switch 111 and a second Ovonic Threshold Switch 112. Each of the first and second Ovonic Threshold Switches 111 and 112 may be a three-terminal Ovonic Threshold Switch 3T. The first and second three-terminal threshold switches 111 and 112 may be the same as each other. The first three-terminal threshold switch 111 may receive the power supply voltage VPPWT through its first terminal, may receive the first enable signal WTEN1 through its second terminal, and may be coupled to the first node A at its third terminal thereby receiving the setting voltage VT. The second three-terminal threshold switch 112 may receive the power supply voltage VPPWT through its first terminal, may receive the first enable signal WTEN1 through its second terminal, and may be coupled to the first node A at its third terminal thereby receiving the setting voltage VT. Where the first enable signal WTEN1 is enabled, each of the first and second three-terminal threshold switches 111 and 112 may be turned on when a voltage difference between the first and third terminals of the first and second three-terminal threshold switches 111 and 112 is equal to or higher than a threshold voltage, or when an amount of current flowing through each of the first and second three-terminal threshold switches 111 and 112 is equal to or greater than a threshold current. The power supply voltage VPPWT may have a higher level than the setting voltage VT. The setting voltage VT may set a turn-on condition of the respective first and second three-terminal threshold switches 111 and 112. When the first enable signal WTEN1 is enabled, the first and second three-terminal threshold switches 111 and 112 may provide a current to the first node A. For example, a level difference between the power supply voltage VPPWT and the setting voltage VT may correspond to a level of the threshold voltage.

The current adjusting circuit 120 may adjust the amount of current provided from the current applying circuit 110 based on a bias voltage VBIAS. The current adjusting circuit 120 may receive a second enable signal WTEN2 and the bias voltage VBIAS. The current adjusting circuit 120 may provide the bias voltage VBIAS to the first node A when the second enable signal WTEN2 is enabled. The bias voltage VBIAS may have a lower level than the setting voltage VT. The bias voltage VBIAS may be at any level that is suitable for controlling a current provided from the current applying circuit 110. For example, the bias voltage VBIAS may have any level between the threshold voltage and the setting voltage VT. The current adjusting circuit 120 may include a first transistor 121. The first transistor 121 may be an N channel MOS transistor. The first transistor 121 may receive the second enable signal WTEN2 through its gate, may receive the bias voltage VBIAS through its drain, and may be coupled to the first node A at its source. The current adjusting circuit 120 may control an amount of current provided through the first and second three-terminal threshold switches 111 and 112 by providing the bias voltage VBIAS to the third terminals of the first and second three-terminal threshold switches 111 and 112 in response to the second enable signal WTEN2.

The current driver 100 may further include an initial voltage setting circuit 130. The initial voltage setting circuit 130 may provide the setting voltage VT to the first node A based on an initialization signal INT. The initial voltage setting circuit 130 may turn on the first and second three-terminal threshold switches 111 and 112 by providing the setting voltage VT to the third terminals of the first and second three-terminal threshold switches 111 and 112 through the first node A when the initialization signal INT is enabled. The initial voltage setting circuit 130 may include a second transistor 131. The second transistor 131 may be an N channel MOS transistor. The second transistor 131 may receive the initialization signal INT through its gate, may receive the setting voltage VT through its drain, and may be coupled to the first node A at its source.

The current driver 100 may further include a current switching circuit 140 and an output resistance circuit 150. The current switching circuit 140 may output a current provided from the current applying circuit 110 based on a current applying signal WTST. The current switching circuit 140 may provide a second node B and a third node C with a current provided to the first node A when the current applying signal WTST is enabled. The current switching circuit 140 may include a third transistor 141 and a fourth transistor 142. Each of the third and fourth transistors 141 and 142 may be a P channel MOS transistor. The third transistor 141 may receive the current applying signal WTST through its gate, may be coupled to the first node A at its source, and may be coupled to the second node B at its drain. The fourth transistor 142 may receive the current applying signal WTST through its gate, may be coupled to the first node A at its source, and may be coupled to the third node C at its drain. The third and fourth transistors 141 and 142 may provide the second and third nodes B and C with a current provided from the current applying circuit 110 when the current applying signal WTST is enabled.

The output resistance circuit 150 may be coupled to the second and third nodes B and C. The output resistance circuit 150 may output an output current Io from a current provided from the current switching circuit 140. The output resistance circuit 150 may increase the overall load resistance of the current driver 100. For example, the output current Io may be provided to other internal or external circuits coupled to the current driver 100. Here, an amount of the output current Io may vary according to a load resistance of internal or external circuits coupled to the current driver 100. The output resistance circuit 150 may stabilize the output current Io. The output resistance circuit 150 may minimize the change in the output current Io by increasing the load resistance of the current driver 100. The output resistance circuit 150 may include a fifth transistor 151, a current source 152, and a sixth transistor 153. Each of the fifth and sixth transistors 151 and 153 may be a P channel MOS transistor. The fifth transistor 151 may receive a load reference voltage VREFP through its gate, may be coupled to the second node B at its source, and may receive the load reference voltage VREFP through its drain. The current source 152 may be coupled between a ground voltage VSS and the drain of the fifth transistor 151. The sixth transistor 153 may receive the load reference voltage VREFP through its gate, may be coupled to the third node C at its source, and may output the output current Io through its drain. The fifth transistor 151 and the current source 152 together with the sixth transistor 153 may form a current mirror.

Figure 2:
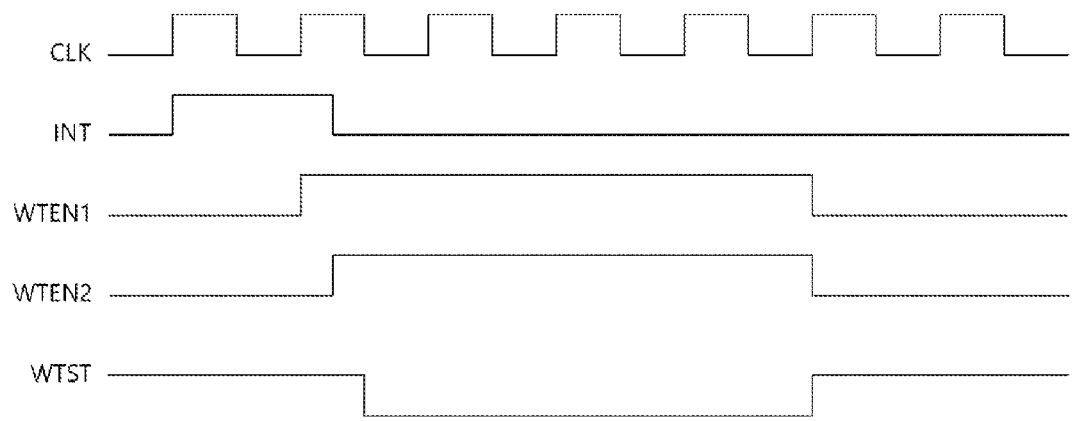
FIG. 2 is a timing diagram illustrating an example operation of a current driver in accordance with an embodiment.
Figure 3:
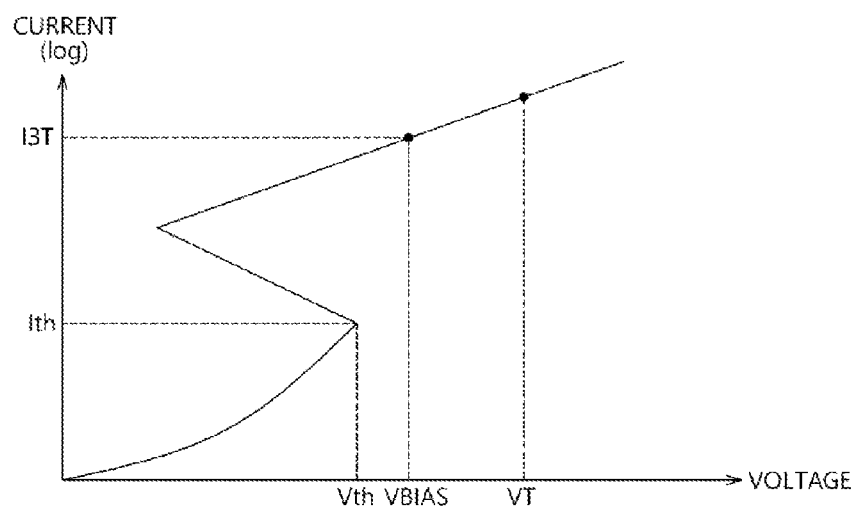
FIG. 3 is a graph illustrating electrical characteristics of first and second Ovonic Threshold Switches.

FIG. 2 is a timing diagram illustrating an example operation of the current driver 100, and FIG. 3 is a graph illustrating electrical characteristics of the first and second three-terminal threshold switches 111 and 112. Hereinafter, described with reference to FIGS. 1 to 3 will be the operation of the current driver 100. The initialization signal INT, the first enable signal WTEN1, the second enable signal WTEN2 and the current applying signal WTST may be generated on the basis of a clock signal CLK. For example, when the initialization signal INT, the first enable signal WTEN1 and the second enable signal WTEN2 are enabled, they may be at a high level (e.g., logic high level). By contrast, when the current applying signal WTST is enabled, it may be at a low level (e.g., logic low level). The initialization signal INT may be enabled first, and then the first enable signal WTEN1 may be enabled. The second enable signal WTEN2 may be enabled at a time when the initialization signal INT is disabled. The current applying signal WTST may be enabled last. In FIG. 3, the horizontal axis may represent a voltage, and the vertical axis may represent a current, on a logarithmic scale.

When the initialization signal INT is enabled, the setting voltage VT may be provided to the third terminals of the first and second three-terminal threshold switches 111 and 112. Since the power supply voltage VPPWT and the setting voltage VT are provided to the first and third terminals of the respective first and second three-terminal threshold switches 111 and 112, the turn-on conditions of the first and second three-terminal threshold switches 111 and 112 may be met. When the first enable signal WTEN1 is enabled, the first and second three-terminal threshold switches 111 and 112 may provide a current to the first node A. As illustrated in FIG. 3, each of the first and second three-terminal threshold switches 111 and 112 may be turned on and allow an amount of current flowing through the first and second three-terminal threshold switches 111 and 112 to drastically increase when a voltage difference between the first and third terminals is equal to or higher than the threshold voltage Vth or when a current having an amount equal to or greater than an amount of the threshold current Ith. The current driver 100 may reduce its size and improve its current-drivability by using three-terminal threshold switches.

After that, when the second enable signal WTEN2 is enabled, the bias voltage VBIAS, instead of the setting voltage VT, may be provided to the third terminals of the first and second three-terminal threshold switches 111 and 112. Accordingly, an amount of current flowing through the first and second three-terminal threshold switches 111 and 112 may be controlled. Since the bias voltage VBIAS has any voltage level between the threshold voltage Vth and the setting voltage VT, an amount of current that the current driver 100 is capable of providing may be controlled by controlling the level of the bias voltage VBIAS. When the current applying signal WTST is enabled, the current switching circuit 140 may provide the second and third nodes B and C with a current provided to the first node A. The current provided to the third node C may be output as the output current Io through the output resistance circuit 150.

Figure 4:
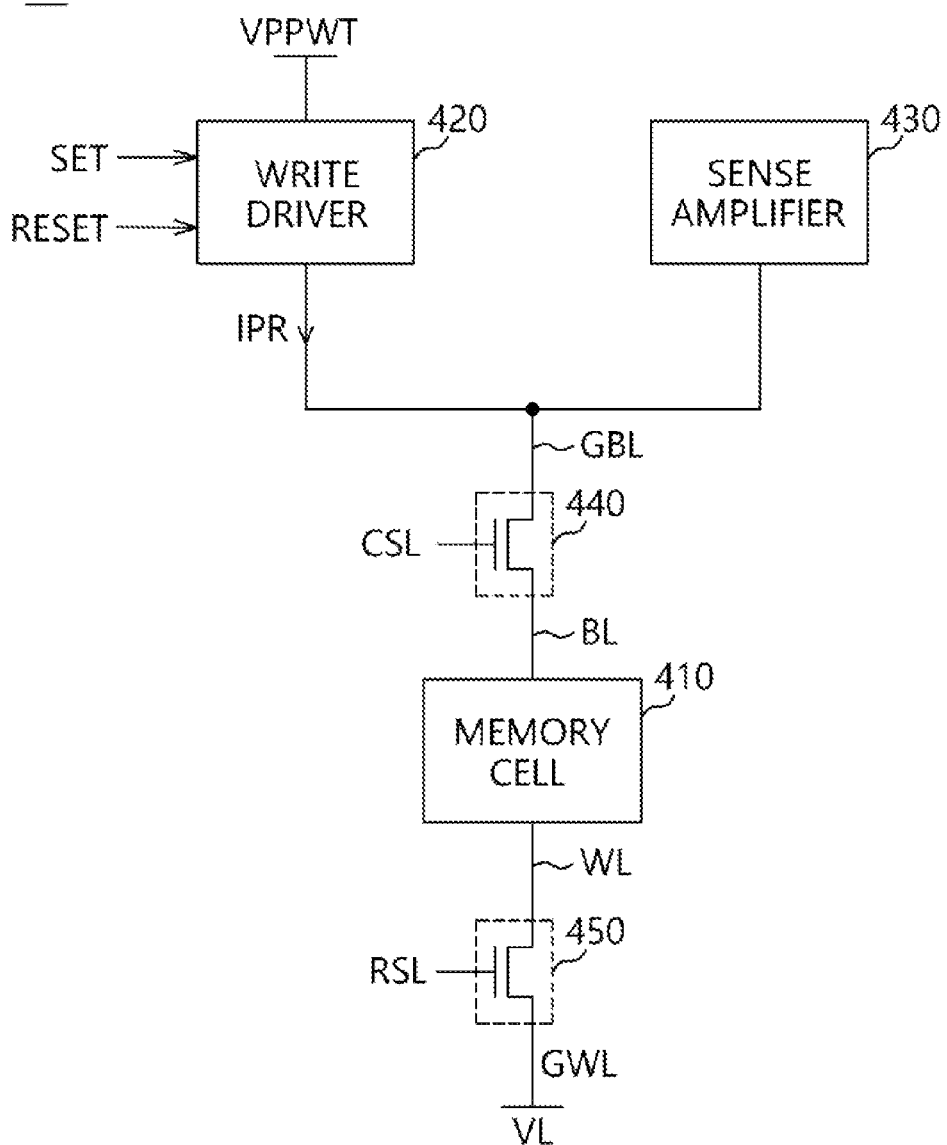
FIG. 4 is a diagram illustrating an example configuration of a semiconductor memory apparatus in accordance with an embodiment.

FIG. 4 is a diagram illustrating an example configuration of a semiconductor memory apparatus 4 in accordance with an embodiment. Referring to FIG. 4, the semiconductor memory apparatus 4 may include a memory cell 410 and a write driver 420. Although not illustrated, the memory cell 410 may include a phase-change device and an Ovonic Threshold Switch. The memory cell 410 may be coupled between a bit line BL and a word line WL. The memory cell 410 may be one of a plurality of memory cells in a memory cell array. The memory cell 410 may be accessed when the bit line BL and the word line WL coupled to the memory cell 410 are selected. The semiconductor memory apparatus 4 may have a hierarchical bit line structure and a hierarchical word line structure. For example, in the memory cell array of the semiconductor memory apparatus 4, a plurality of bit lines may be coupled in common to a global bit line GBL, and a plurality of word lines may be coupled in common to a global word line GWL. The semiconductor memory apparatus 4 may further include a column switch 440 and a row switch 450. The column switch 440 may couple the bit line BL to the global bit line GBL based on a column selection signal CSL. The column selection signal CSL may be generated on the basis of a column address signal. The row switch 450 may couple a word line WL coupled to the memory cell 410 to the global word line GWL based on a row selection signal RSL. The row switch 450 may couple the memory cell 410 to the global word line GWL when the row selection signal RSL is enabled. The row selection signal may be enabled on the basis of a row address signal.

The write driver 420 may provide a program current IPR to the memory cell 410 based on program signals SET and RESET. The program signals SET and RESET may be write signals for storing data into the memory cell 410. The program signals SET and RESET may include a set program signal SET and a reset program signal RESET. The set program signal SET may be a program signal for storing first level data into the memory cell 410 by turning the phase-change device of the memory cell 410 into a low resistance state. The reset program signal RESET may be a program signal for storing a second level data into the memory cell 410 by turning the phase-change device of the memory cell 410 into a high resistance state. It should be understood that the number of program states here (i.e., SET and RESET) is intended to be illustrative only and the invention is not limited thereto. When the memory cell 410 is a multi-level cell capable of storing multi-level data, the program signals SET and RESET may include three or more program signals. The write driver 420 may generate the program current IPR for turning the memory cell 410 into a low resistance state based on the set program signal SET, and may generate the program current IPR for turning the memory cell 410 into a high resistance state based on the reset program signal RESET. The write driver 420 may provide the program current IPR to the global bit line GBL. The memory cell 410 may receive the program current IPR when the bit line BL is coupled to the global bit line GBL through the column switch 440, and a resistance state of the memory cell 410 may be set on the basis of the received program current IPR. The write driver 420 may receive the power supply voltage VPPWT, and may generate the program current IPR from the power supply voltage VPPWT based on the program signals SET and RESET. A low voltage VL may be provided to the global word line GBL. The low voltage VL may have a negative level such as a ground voltage or a bulk bias voltage.

The semiconductor memory apparatus 4 may further include a read sense amplifier 430. The read sense amplifier 430 may read data stored in the memory cell 410. For example, the read sense amplifier 430 may read data stored in the memory cell 410 by providing a read voltage to the memory cell 410 and detecting a voltage and/or a current output from the memory cell 410 according to a resistance state of the memory cell 410.

Figure 5:
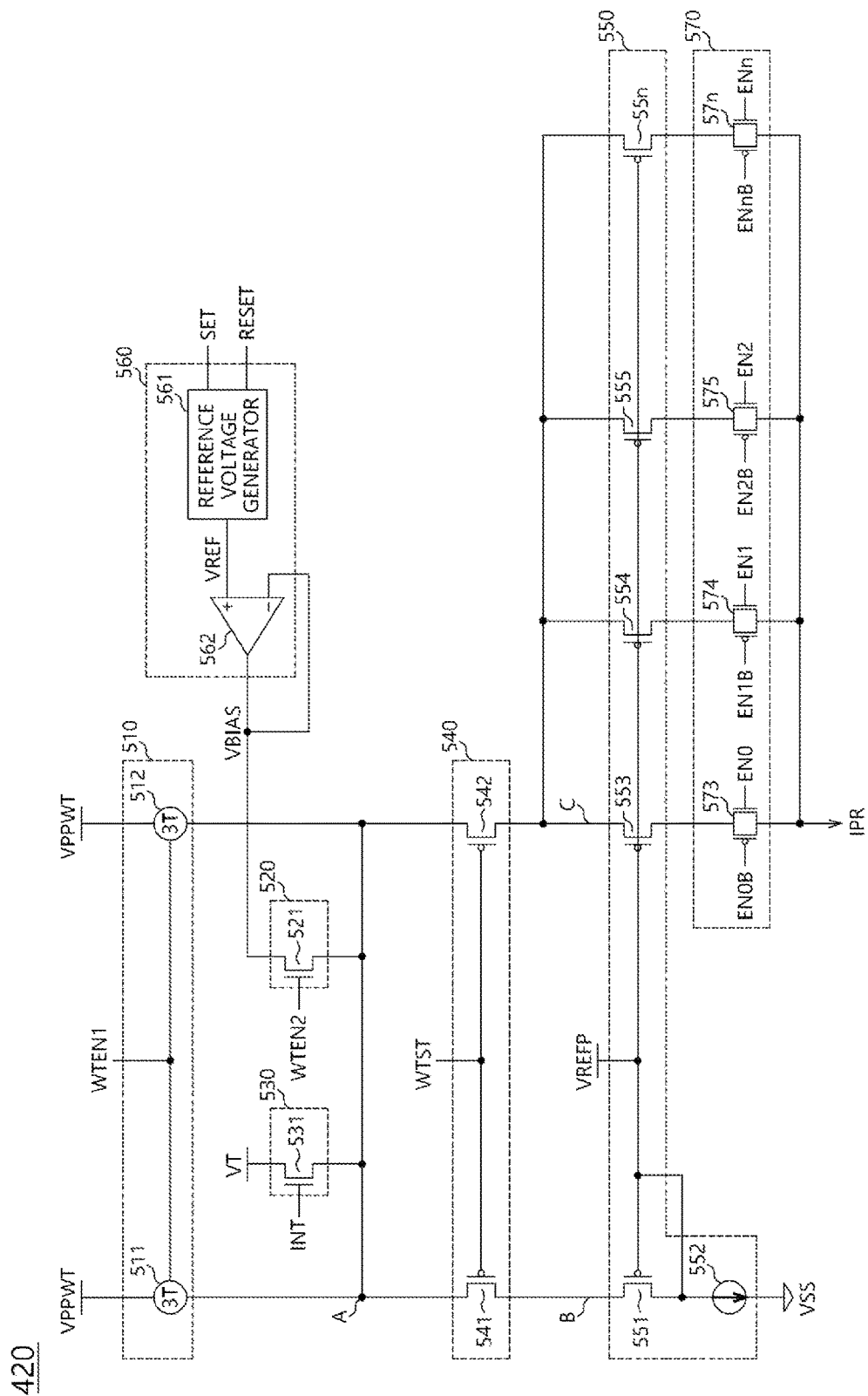
FIG. 5 is a diagram illustrating an example configuration of a write driver shown in FIG. 4.

FIG. 5 is a diagram illustrating an example configuration of the write driver 420 shown in FIG. 4. The configuration of the current driver 100 of FIG. 1 may be applied to the write driver 420. The write driver 420 may include a current applying circuit 510 and a current adjusting circuit 520. The current applying circuit 510 may include first and second three-terminal Ovonic Threshold Switches 511 and 512. The first and second three-terminal threshold switches 511 and 512 may be turned on by receiving a power supply voltage VPPWT, a first enable signal WTEN1, and a setting voltage VT, and may be provide a current to a first node A when turned on. The current adjusting circuit 520 may receive a second enable signal WTEN2 and a bias voltage VBIAS. The current adjusting circuit 520 may adjust an amount of current provided from the current applying circuit 510 by providing the bias voltage VBIAS to the first node A when the second enable signal WTEN2 is enabled. The current adjusting circuit 520 may include a first transistor 521. The first transistor 521 may receive the second enable signal WTEN2 through its gate, may receive the bias voltage VBIAS through its drain, and may be coupled to the first node A at its source.

The write driver 420 may further include a bias voltage generator 560. The bias voltage generator 560 may generate the bias voltage VBIAS based on the program signals SET and RESET. The bias voltage generator 560 may generate the bias voltage VBIAS having relatively low level based on the set program signal SET, and may generate the bias voltage VBIAS having relatively high level based on the reset program signal RESET. The bias voltage generator 560 may variously change the program current IPR that the write driver 420 is capable of providing by generating the bias voltage VBIAS having various levels based on the program signals SET and RESET. The bias voltage generator 560 may include a reference voltage generator 561 and an amplifier 562. The reference voltage generator 561 may generate a reference voltage VREF having various levels based on the program signals SET and RESET. The amplifier 562 may receive the reference voltage VREF and the bias voltage VBIAS, which is fed back from an output terminal of the amplifier 562. The amplifier 562 may generate the bias voltage VBIAS having a level corresponding to a level of the reference voltage VREF.

The write driver 420 may further include an initial voltage setting circuit 530. The initial voltage setting circuit 530 may provide the setting voltage VT to the first node A based on an initialization signal INT. The initial voltage setting circuit 530 may include a second transistor 531. The second transistor 531 may receive the initialization signal INT through its gate, may receive the setting voltage VT through its drain, and may be coupled to the first node A at its source.

The write driver 420 may further include a current switching circuit 540 and an output resistance circuit 550. The current switching circuit 540 may output a current provided from the current applying circuit 510 based on a write operation signal WTST. The current switching circuit 540 may provide a second node B and a third node C with a current provided from the current applying circuit 510 to the first node A when the write operation signal WTST is enabled. The write operation signal WTST may be substantially the same as the current applying signal WTST of FIG. 1. The write operation signal WTST may be enabled when the program current IPR is provided to the memory cell 410. The current switching circuit 540 may include a third transistor 541 and a fourth transistor 542. The third transistor 541 may receive the write operation signal WTST through its gate, may be coupled to the first node A at its source, and may be coupled to the second node B at its drain. The fourth transistor 542 may receive the write operation signal WTST through its gate, may be coupled to the first node A at its source, and may be coupled to the third node C at its drain.

The output resistance circuit 550 may stabilize the program current IPR by increasing a load resistance of the write driver 420. The output resistance circuit 550 may include a fifth transistor 551, a current source 552, and a plurality of path transistors 553, 554, 555, . . . , 55n. The fifth transistor 551 and the current source 552 together with the plurality of path transistors 553, 554, 555, . . . , 55n may form a current mirror. The plurality of path transistors 553, 554, 555, . . . , 55n may form a plurality of current paths based on the load reference voltage VREFP. The fifth transistor 551 may receive the load reference voltage VREFP through its gate, and may be coupled to the second node B at its source. The current source 552 may be coupled between a ground voltage VSS and a drain of the fifth transistor 551. Each of the plurality of path transistors 553, 554, 555, . . . , 55n may receive the load reference voltage VREFP through its gate, may be coupled to the third node C at its source, and may output a current provided to the third node C through its drain.

The write driver 420 may further include a program current output circuit 570. The program current output circuit 570 may output a current provided from the output resistance circuit 550 as the program current IPR based on the program signals SET and RESET. The program current output circuit 570 may control a current intensity of the program current IPR based on the program signals SET and RESET. The program current output circuit 570 may include a plurality of path gates 573, 574, 575, . . . , 57n. The plurality of path gates 573, 574, 575, . . . , 57n may be coupled to the plurality of path transistors 553, 554, 555, . . . , 55n one by one, and may be turned on based on assigned control signals EN0, EN1, EN2, . . . , ENn and inverted signals EN0B, EN1B, EN2B, . . . , ENnB of the assigned control signals EN0, EN1, EN2, . . . , ENn. The plurality of path gates 573, 574, 575, . . . , 57n may output the program current IPR by selecting a number of current paths, which are formed by the plurality of path transistors 553, 554, 555, . . . , 55n and transfer the program current IPR. The control signals EN0, EN1, EN2, . . . , ENn may be generated on the basis of the program signals SET and RESET. As a number of enabled control signals EN0, EN1, EN2, . . . , ENn becomes greater, the program current IPR may be output through greater number of current paths and the current intensity of the program current IPR may become greater. As a number of enabled control signals EN0, EN1, EN2, . . . , ENn becomes smaller, the program current IPR may be output through smaller number of current paths and the current intensity of the program current IPR may become weaker.

Figure 6:
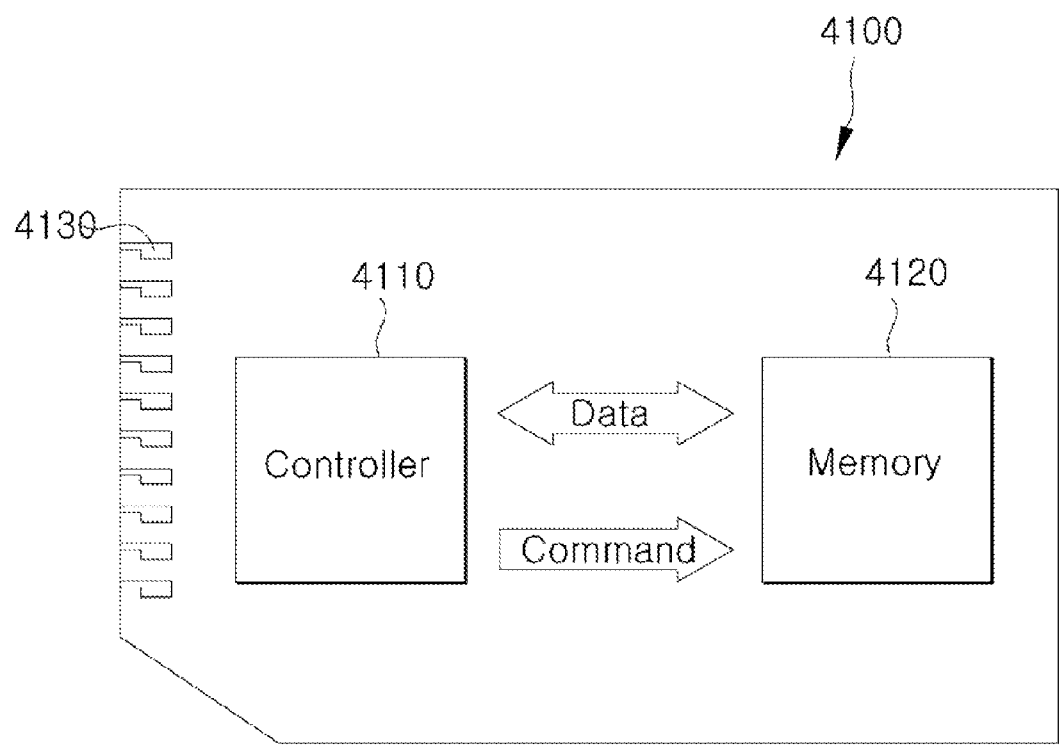
FIG. 6 is a schematic diagram illustrating a memory card including a semiconductor memory apparatus in accordance with various embodiments.

FIG. 6 is a schematic diagram illustrating a memory card 4100 including a semiconductor memory apparatus in accordance with various embodiments. Referring to FIG. 6, the memory card system 4100 may include a controller 4110, a memory 4120, and an interface member 4130. The controller 4110 and the memory 4120 may exchange a command and/or data. For example, the memory 4120 may be used to store a command, which is executed by the controller 4110, and/or may be used to store user data.

The memory card system 4100 may store data into the memory 4120 or output data to an external from the memory 4120. The memory 4120 may include the memory apparatus 4 in accordance with various embodiments.

The interface member 4130 may transfer data from/to an external. The memory card system 4100 may be a multimedia card (MMC), a secure digital card (SD) or a portable data storage device.

Figure 7:
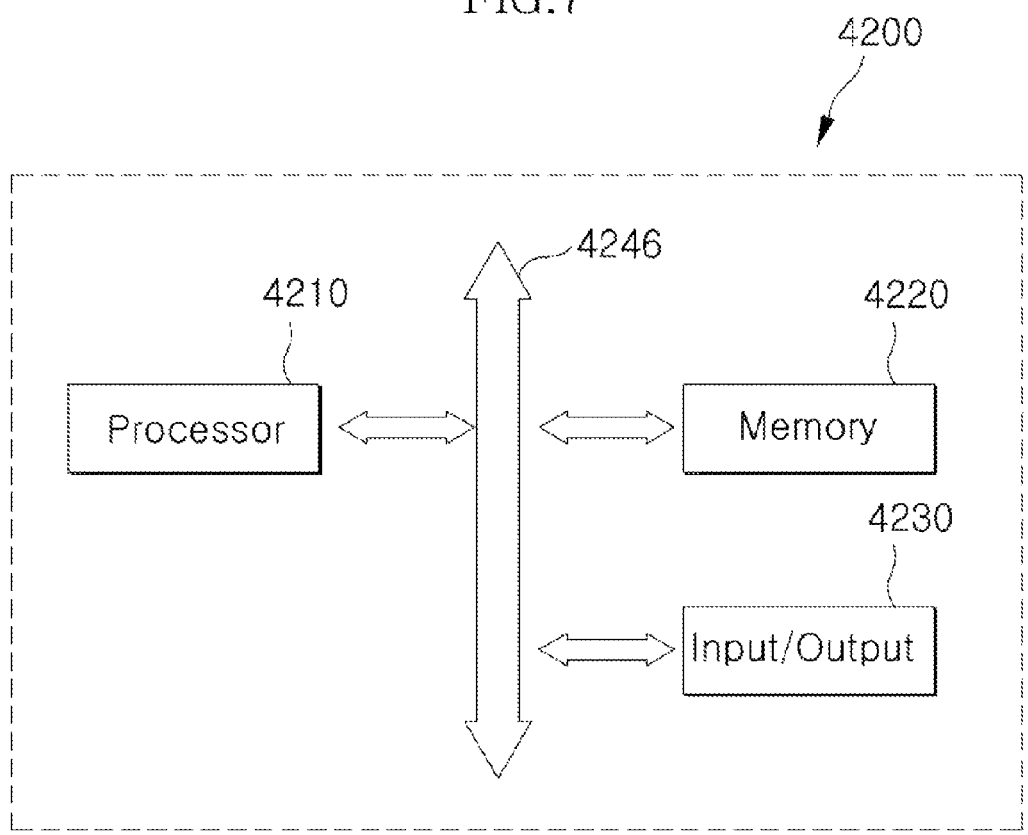
FIG. 7 is a diagram illustrating an example of an electronic device including a semiconductor memory apparatus in accordance with various embodiments.

FIG. 7 is a diagram illustrating an example of an electronic device 4200 including a semiconductor memory apparatus in accordance with various embodiments. Referring to FIG. 7, the electronic device 4200 may include a processor 4210, a memory 4220, and an input/output device 4230. The processor 4210, the memory 4220 and the input/output device 4230 may be coupled to one another through a bus 4246.

The memory 4220 may receive a control signal from the processor 4210. The memory 4220 may be used to store code and data for the operation of the processor 4210. The memory 4220 may be used to store data, which is accessed through the bus 4246. The memory 4220 may include the memory apparatus 4 in accordance with various embodiments. Additional circuits and control signals may be provided for implementations and modifications of the present disclosure.

The electronic device 4200 may be included in various electronic control devices requiring the memory 4220. For example, the electronic device 4200 may be used in a personal digital assistant (PDA), a laptop computer, a portable computer, a web tablet, a wireless phone, a portable phone, a digital music player, a MP3 player, a navigation, a solid state disk (SSD), a household appliance, or any device capable of wireless communication.

Figure 8:
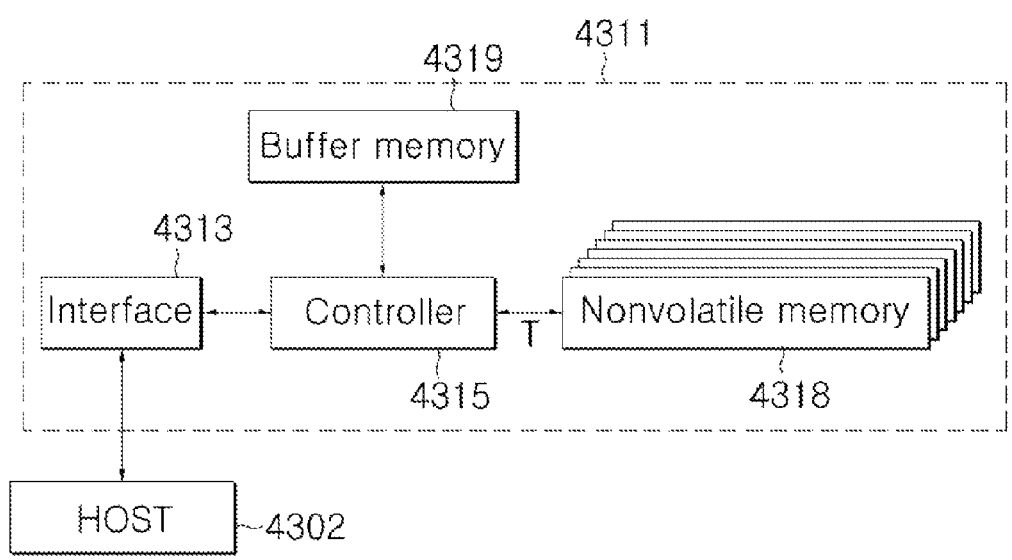
FIG. 8 is a diagram illustrating an example of a data storage device including a semiconductor memory apparatus in accordance with various embodiments.
Figure 9:
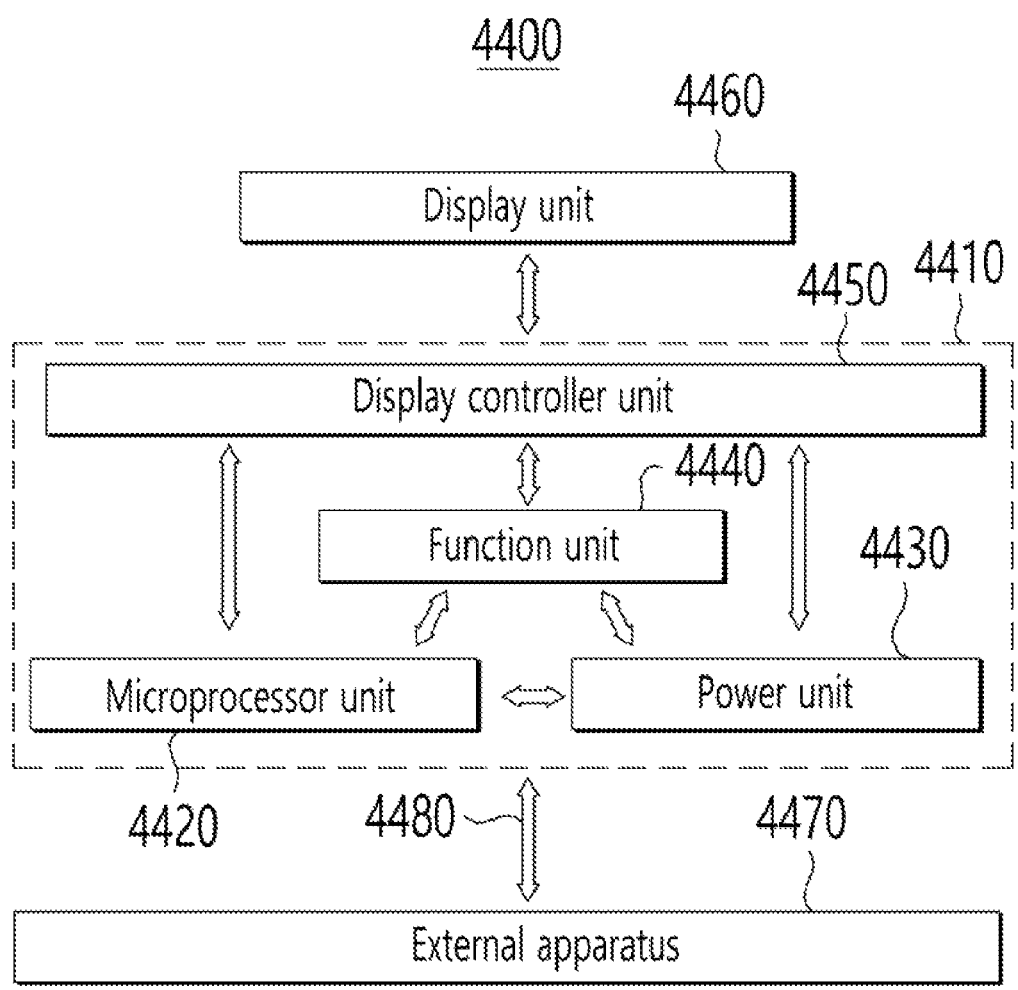
FIG. 9 is a diagram illustrating an example of an electronic system including a semiconductor memory apparatus in accordance with various embodiments.

With reference to FIGS. 8 and 9, detailed examples of the implementations and modifications of the electronic device 4200 will be discussed.

FIG. 8 is a diagram illustrating an example of a data storage device including a semiconductor memory apparatus in accordance with various embodiments. Referring to FIG. 8, a data storage device such as the solid state disk (SSD: 4311) may be provided. The SSD 4311 may include an interface 4313, a controller 4315, a nonvolatile memory 4318, and a buffer memory 4319.

The SSD 4311 stores data in a semiconductor apparatus. The SSD 4311 has an advantage over the hard disk drive (HDD) in terms of speed, size, and weight. The SSD 4311 may also have a low mechanical delay/failure rate and a low noise level. The SSD 4311 is widely used in a notebook PC, a netbook, a desktop PC, a MP3 player, or a portable storage device.

The controller 4315 may be disposed near the interface 4313, and may be electrically coupled to the interface 4313. The controller 4315 may be a microprocessor including a memory controller and a buffer controller. The non-volatile memory 4318 may be disposed near the controller 4315, and may be electrically coupled to the controller 4315 through a connection terminal T. Data storage capacity of the SSD 4311 may correspond to that of the non-volatile memory 4318. The buffer memory 4319 may be disposed near the controller 4315, and may be electrically coupled to the controller 4315.

The interface 4313 may be coupled to a host 4302, and may transfer electrical signals such as data signals. For example, the interface 4313 may conform to a protocol such as SATA, IDE, SCSI, and/or combination thereof. The non-volatile memory 4318 may be coupled to the interface 4313 through the controller 4315.

The non-volatile memory 4318 may store data provided through the interface 4313. The non-volatile memory 4318 may include the memory apparatus 4 in accordance with various embodiments. The non-volatile memory 4318 may retain stored data even when power supply to the SSD 4311 is cut off.

The buffer memory 4319 may include a volatile memory. The volatile memory may be DRAM and/or SRAM. The buffer memory 4319 may operate faster than the non-volatile memory 4318.

The interface 4313 may process data faster than the non-volatile memory 4318. The buffer memory 4319 may temporarily store data. Data provided through the interface 4313 may be temporarily stored in the buffer memory 4319 via the controller 4315, and may be stored in the non-volatile memory 4318 at the data storage speed of the non-volatile memory 4318.

Among data stored in the non-volatile memory 4318, frequently accessed data may be read in advance from the non-volatile memory 4318 and temporarily stored in the buffer memory 4319. That is, the buffer memory 4319 may be used to increase effective operation speed of the SSD 4311 and reduce error rate of the SSD 4311.

FIG. 9 is a diagram illustrating an example of an electronic system 4400 including a semiconductor memory apparatus in accordance with various embodiments. Referring to FIG. 9, the electronic system 4400 may include a body 4410. a microprocessor circuit 4420, a power circuit 4430, a function circuit 4440, and a display controller circuit 4450.

The body 4410 may be a motherboard formed with the printed circuit board (PCB). The microprocessor circuit 4420, the power circuit 4430, the function circuit 4440, and the display controller circuit 4450 may be mounted on the body 4410. A display circuit 4460 may be disposed in or outside the body 4410. For example, the display circuit 4460 may be disposed on a surface of the body 4410 and display image processed by the display controller circuit 4450.

The power circuit 4430 may receive a predetermined voltage from an external battery, divide the provided voltage into required voltages of various levels, and provide the divided voltages to the microprocessor circuit 4420, the function circuit 4440, the display controller circuit 4450 and so forth. The microprocessor circuit 4420 may receive the divided voltage from the power circuit 4430, and may control the function circuit 4440 and the display circuit 4460. The function circuit 4440 may perform various functions of the electronic system 4400. For example, if the electronic system 4400 is a cellular phone, the function circuit 4440 may include various element capable of cellular phone functions such as dialing, image output to the display circuit 4460 and voice output to a speaker through communication with an external device 4470 and so forth, and may function as a camera image processor when a camera is installed in the electronic system 4400.

If the electronic system 4400 is coupled to a memory card for storage capacity expansion, the function circuit 4440 may be a memory card controller. The function circuit 4440 may exchange signals with the external device 4470 through a wired or wireless communication circuit 4480. If the electronic system 4400 requires a device such as a universal serial bus (USB) storage device for function expansion, the function circuit 4440 may work as an interface controller. The memory apparatus 4 in accordance with various embodiments may be applied to one or more of the microprocessor circuit 4420 and the function circuit 4440.

While certain embodiments have been described above, it will be understood to those skilled in the art that the embodiments described are by way of example only. Accordingly, the current driver, write driver and semiconductor memory apparatus using the same should not be limited based on the described embodiments. Rather, the current driver, write driver and semiconductor memory apparatus using the same described herein should only be limited in light of the claims that follow when taken in conjunction with the above description and accompanying drawings.

What is claimed is:

1. A semiconductor memory apparatus comprising:
   a write driver configured to generate a program current based on a program signal; and
   a memory cell configured to store data by receiving the program current,
   wherein the write driver includes:
   a current applying circuit having an Ovonic Threshold Switch configured to be turned on based on a power supply voltage, a first enable signal, and a setting voltage, and configured to provide a current; and a current adjusting circuit configured to control an amount of the current provided from the current applying circuit based on a second enable signal and a bias voltage generated based on the program signal.

2. The semiconductor memory apparatus of claim 1, wherein the Ovonic Threshold Switch has a first terminal receiving the power supply voltage, a second terminal receiving the first enable signal, and a third terminal receiving the setting voltage or the bias voltage, and outputs the current through the third terminal.

3. The semiconductor memory apparatus of claim 1, wherein the write driver further includes an initial voltage setting circuit configured to provide the setting voltage to the current applying circuit based on an initialization signal.

4. The semiconductor memory apparatus of claim 1, wherein a level difference between the power supply voltage and the setting voltage corresponds to a level of a threshold voltage of the Ovonic Threshold Switch.

5. The semiconductor memory apparatus of claim 1, wherein the bias voltage has a level higher than the threshold voltage of the Ovonic Threshold Switch and lower than the setting voltage.

6. The semiconductor memory apparatus of claim 1, wherein the write driver further includes a bias voltage generator configured to generate the bias voltage based on the program signal.

7. The semiconductor memory apparatus of claim 6, wherein the bias voltage generator includes:

a reference voltage generator configured to generate a reference voltage based on the program signal; and
an amplifier configured to generate the bias voltage having a level corresponding to a level of the reference voltage.

8. The semiconductor memory apparatus of claim 1, further comprising:
a global bit line coupled to the write driver; and
a bit line coupled to the memory cell, and coupled to the global bit line through a column switch.

9. The semiconductor memory apparatus of claim 8, further comprising a row switch configured to couple the memory cell to a global word line.

10. The semiconductor memory apparatus of claim 9, further comprising a current switching circuit configured to output the current provided from the current applying circuit based on a write operation signal.

11. The semiconductor memory apparatus of claim 10, further comprising an output resistance circuit coupled to the current switching circuit, and configured to receive the current provided from the current switching circuit and increase a load of the write driver.

12. The semiconductor memory apparatus of claim 11, further comprising a program current output circuit configured to output the program current by adjusting an amount of current provided from the output resistance circuit based on the program signal.

* * * * *